United States Patent
Naka

[11] Patent Number: 5,966,044
[45] Date of Patent: Oct. 12, 1999

[54] PULL-UP CIRCUIT AND SEMICONDUCTOR DEVICE USING THE SAME

[75] Inventor: Naoaki Naka, Kawasaki, Japan

[73] Assignee: Fujitsu Limited, Kanagawa, Japan

[21] Appl. No.: 08/964,461

[22] Filed: Nov. 4, 1997

[30] Foreign Application Priority Data

Apr. 25, 1997 [JP] Japan .................................. 9-109791

[51] Int. Cl.⁶ .............................. G05F 1/10; G05F 3/02
[52] U.S. Cl. ........................................... 327/535; 327/537
[58] Field of Search ................................. 327/108, 112, 327/333, 390, 530, 534, 535, 536, 537, 538, 540–543, 546, 589; 326/62, 80–83, 85–87

[56] References Cited

U.S. PATENT DOCUMENTS

| | | | |
|---|---|---|---|
| 5,160,855 | 11/1992 | Dobberpuhl | 327/108 |
| 5,382,846 | 1/1995 | Shigehara et al. | 326/68 |
| 5,422,591 | 6/1995 | Rastegar et al. | 327/409 |
| 5,463,330 | 10/1995 | Tsuchida | 326/81 |
| 5,631,579 | 5/1997 | Miki et al. | 326/58 |
| 5,661,414 | 8/1997 | Shigehara et al. | 326/81 |
| 5,726,590 | 3/1998 | Isono | 326/86 |

FOREIGN PATENT DOCUMENTS

| | | |
|---|---|---|
| 0 614 279 | 9/1994 | European Pat. Off. . |
| 62-11320 | 1/1987 | Japan . |

Primary Examiner—My-Trang Nu Ton
Attorney, Agent, or Firm—Nikaido Marmelstein Murray & Oram LLP

[57] ABSTRACT

A pull-up circuit includes a pull-up transistor of a P-channel type having a drain coupled to a bus via a terminal, a source, a gate and a back gate, and a control circuit controlling the pull-up transistor so that no currents flow in a first current path formed from the drain to the back gate and a second path formed from the drain to the source.

18 Claims, 6 Drawing Sheets

PULL-UP CIRCUIT AND SEMICONDUCTOR DEVICE USING THE SAME

BACKGROUND OF THE INVENTION

1. Field of the Invention

The present invention relates to a pull-up circuit which raises the potential of a given node in a circuit to a given level and a semiconductor device having such a pull-up circuit.

Semiconductor devices can operate with a reduced power supply voltage in advance of the production process thereof. Under the above situation, there is a case where a system is configured by using semiconductor devices that operate with different power supply voltages.

2. Description of the Related Art

FIG. 1 is a block diagram of a system in which semiconductor devices operating with different power supply voltages are connected together through a bus. The system shown in FIG. 1 is formed on a circuit board. Semiconductor devices A and B are connected together through a bus 10, via which data is transferred therebetween. The semiconductor devices A and B operate with different power supply voltages. For example, the semiconductor device B operates with a power supply voltage of 5 V, and the semiconductor device A operates with a power supply voltage of 3.3 V. When the semiconductor device B outputs data to the bus 10, it drives the potential of the bus 10 to 0 V or 5 V in accordance with the data to be output. When the high potential and low potential of the bus 10 are respectively denoted as Vh and Vl, the semiconductor device B drives the bus 10 so that Vh=5 V and Vl=0 V. Similarly, when the semiconductor device A outputs data to the bus 10, the semiconductor device A drives the bus 10 so that Vh=3.3 V and Vl=0 V.

Generally, the semiconductor devices A and B are equipped with pull-up circuits located in interface parts thereof. In FIG. 1, the internal structure of the semiconductor device A is illustrated for the sake of simplicity. The semiconductor device A has a connection terminal 16 to which the bus 10 is connected. An internal circuit of the semiconductor device A is electrically connected to the bus 10 via the terminal 16. The semiconductor device A has a buffer 12 and a pull-up circuit 14, which are connected to the terminal 16 and form an interface with the bus 10. The buffer 12 is, for example, an input buffer or an output buffer and may be an input/output (bidirectional) buffer. Data on the bus 10 is latched in the buffer 12 via the terminal 16, and is supplied to an internal circuit (not shown) of the semiconductor device A.

The pull-up circuit 14 functions to pull up the potential of the terminal 16 to the power supply voltage of the semiconductor device A. In the case where the semiconductor device A operates with a power supply voltage of 3.3 V, the pull-up circuit 14 pulls up the potential of the terminal 16 to 3.3 V (=Vdd). Hence, it is possible to prevent the potential of the terminal 16 from being at an intermediate level between 0 V and 3.3 V due to a certain factor. If the potential of the terminal 16 becomes such an intermediate level, the buffer 12 and/or the internal circuit may malfunction or wasteful power may be consumed therein.

As shown in FIG. 1, the pull-up circuit 14 is formed of a P-channel MOS transistor (hereinafter, simply referred to as PMOS transistor) or an N-channel MOS transistor (NMOS transistor). When the pull-up circuit 14 is formed of the PMOS transistor, the source thereof is supplied with the power supply voltage Vdd (=3.3 V in the above example), and the gate thereof is fixed at a potential Vss (equal to, for example, 0 V). The drain of the PMOS transistor is connected to the terminal 16. Hence, the PMOS transistor is ON, and pulls up the potential of the terminal 16 to the power supply voltage Vdd. When the NMOS transistor is used, the gate thereof is fixed to the power supply voltage Vdd so that it is ON.

However, the conventional pull-up circuit 14 has the following disadvantages.

As has been described previously, the potential of the bus 10 can be set to 5 V. For example, the semiconductor device B drives the bus 10 to its power supply voltage equal to 5 V. At that time, the potential of the terminal 16 becomes equal to 5 V. If the pull-up circuit 14 is formed of the PMOS transistor, the drain thereof is supplied with a voltage of 5 V. Generally, the back gate voltage of the PMOS transistor is fixed to the power supply voltage, which is equal to 3.3 V in the present example. That is, the drain of the PMOS transistor of the pull-up circuit 14 is at 5 V, while the back gate thereof is at 3.3 V. Hence, a current path directed to the back gate (an N-type well) from the drain is formed. In other words, a diode is connected between the drain and back gate of the PMOS transistor in the forward direction. A current flows in the above current path from the bus 10 to the power supply Vdd. Such a current degrades the reliability of the PMOS transistor and decreases the potential of the bus 10.

There is also a case where another current flows from the drain of the PMOS transistor to the power supply Vdd via the source thereof. When the drain of the PMOS transistor is at 5 V and the source thereof is at 3.3 V (=Vdd), a current path from the drain to the source. When such a current is also considered, the thickness of an oxide film of the PMOS transistor may be increased, or a specific pull-up circuit may be provided to pull up the potential of the bus 10 to 5 V. However, these means may be not practical in terms of the production cost and are not capable of preventing the occurrence of the current itself.

When the pull-up circuit 14 is formed of the NMOS transistor, the source potential thereof is higher than the drain potential thereof, and thus the occurrence of the above currents flowing from the bus 10 can be prevented. However, the NMOS transistor has only a capability of pulling up the bus 10 to a voltage defined by subtracting the threshold voltage of the NMOS transistor from the gate potential (set equal to the power supply voltage Vdd) thereof. Hence, the pull-up circuit 14 formed of the NMOS transistor cannot sufficiently perform the pull-up operation. For example, if the power supply voltage Vdd which is normally equal to 3.3 V is temporarily decreased to 3.0 V, the NMOS transistor can pull up the bus 10 to only 2.5 V with the threshold voltage thereof equal to 0.5 V. Such an intermediate potential functions as an indefinite potential with respect to an internal circuit connected to the buffer 12, and the internal circuit may malfunction.

SUMMARY OF THE INVENTION

It is a general object of the present invention to provide a pull-up circuit in which the above disadvantages are eliminated.

A more specific object of the present invention is to provide a pull-up circuit formed by using a P-channel MOS transistor and capable of preventing a current from flowing in the pull-up circuit from a node even if the potential of the node becomes higher than the power supply voltage applied to the pull-up circuit without increasing the breakdown voltage of the P-channel MOS transistor and affecting circuits connected to the pull-up circuit.

The above objects of the present invention are achieved by a pull-up circuit comprising: a pull-up transistor (20) of a P-channel type having a drain coupled to a bus via a terminal, a source, a gate and a back gate; and a control circuit (which corresponds to a first power supply circuit 22 and a second power supply circuit 24 as will be described later) controlling the pull-up transistor so that no currents flow in a first current path formed from the drain to the back gate and a second path formed from the drain to the source.

The pull-up circuit may be configured so that the control circuit controls the gate and the back gate so that no currents flow in the first and second current paths.

The above objects of the present invention are also achieved by a pull-up circuit comprising: a pull-up transistor (20) of a P-channel type having a drain coupled to a bus via a terminal, a source having a first power supply potential V1 from a first power supply line (34), a gate and a back gate; a first power supply circuit (22) which defines a well potential (Vw) approximately equal to a higher one of the first power supply potential and a potential Vx applied to the drain from the bus via the terminal and sets the back gate to the well potential; and a second power supply circuit (24) which defines a gate potential (Vg) so the gate potential is approximately equal to the potential Vx when the potential Vx exceeds the first power supply potential and is approximately equal to a second power supply potential V2 that is supplied from a second power supply line (48) and is lower than the first power supply potential. The gate is set to the gate potential defined by the second power supply circuit.

The above pull-up circuit may be configured so that the pull-up transistor has a threshold level by which the pull-up transistor is turned OFF when the potential Vx exceeds the first power supply potential V1 and is turned ON when the potential Vx is lower than the first power supply potential V1.

The above pull-up circuit may be configured so that the first power supply circuit comprises: a first switch element (30) which is provided between the first power supply line and the back gate and which is turned OF when Vx>V1 and is turned ON when Vx<V1; and a second switch element (32) which is provided between the terminal and the back gate and which is turned ON when Vx>V1 and is turned OFF when Vx<V1.

The pull-up circuit may be configured so that: the first switch element is a first P-channel transistor (30) having a back gate set to the well potential defined by the first power supply circuit, and a gate set to the potential Vx; and the second switch element is a second P-channel transistor (32) having a back gate set to the well potential, and a gate set to the first power supply voltage V1.

The above pull-up circuit may be configured so that the second power supply circuit comprises: a third switch element (40) which is provided between the terminal and the gate of the pull-up transistor and which is turned ON when Vx>V1 and is turned OFF when Vx<V1; a fourth switch element (46) which is provided between the gate of the pull-up transistor and the second power supply line; and a switch control circuit (42, 44) which turns OFF the fourth switch when Vx>V1 and turns ON the fourth switch when Vx<V1.

The above pull-up circuit may be configured so that: the third switch element is a third P-channel transistor (40) having a back gate set to the well potential defined by the first power supply circuit, and a gate set to the power supply potential V1; and the fourth switch element is a first N-channel transistor (46) having a gate potential controlled by the switch control circuit.

The above pull-up circuit may be configured so that the switch control circuit comprises: a fifth switch element (42) which is connected between the first power supply line and a control terminal of the fourth switch element and which is turned OFF when Vx>V1 and is turned ON when Vx<V1; and a sixth switch element (44) which is connected between the second power supply line and the control terminal of the fourth switch element and which is turned ON when Vx>V1 and is turned OFF when Vx<V1.

The pull-up circuit may be configured so that: the fifth switch element is a fourth P-channel transistor (42) having a gate set to the potential Vx; and the sixth switch element is a second N-channel transistor (44) having a gate set to the gate potential.

The pull-up circuit may further comprise: a third N-channel transistor (50) which is provided between a first node at which the third switch element and the gate of the pull-up transistor are connected and a second node at which the second and sixth switch elements are connected and which has a gate supplied with a third power supply potential V3 so that the third N-channel transistor is turned ON when the fourth switch element is turned ON; and a fourth N-channel transistor (52) which is provided between the fifth switch element and the terminal and has a gate supplied with the first power supply potential V1.

The above objects of the present invention are also achieved by a semiconductor device comprising: a buffer coupled to a terminal to which a bus is connected; and a pull-up circuit, the pull-up circuit comprising: a pull-up transistor of a P-channel type having a drain coupled to the bus via the terminal, a source, a gate and a back gate; and a control circuit controlling the pull-up transistor so that no currents flow in a first current path formed from the drain to the back gate and a second path formed from the drain to the source.

The above pull-up circuit may be configured so that the control circuit controls the gate and the back gate so that no currents flow in the first and second current paths.

The above objects of the present invention are achieved by a semiconductor device comprising: a buffer coupled to a terminal to which a bus is connected; and a pull-up circuit, the pull-up circuit comprising: a pull-up transistor of a P-channel type having a drain coupled to the bus via the terminal, a source having a first power supply potential V1 from a first power supply line, a gate and a back gate; a first power supply circuit which defines a well potential approximately equal to a higher one of the first power supply potential and a potential Vx applied to the drain from the bus via the terminal and sets the back gate to the well potential; and a second power supply circuit which defines a gate potential so the gate potential is approximately equal to the potential Vx when the potential Vx exceeds the first power supply potential and is approximately equal to a second power supply potential V2 that is supplied from a second power supply line and is lower than the first power supply potential, the gate being set to the gate potential defined by the second power supply circuit.

The above objects of the present invention are also achieved by a system comprising: a circuit board; a plurality of semiconductor devices mounted on the circuit board and connected together via a bus, at least one of the plurality of semiconductor devices including a pull-up circuit, the pull-up circuit comprising: a pull-up transistor of a P-channel type having a drain coupled to the bus via the terminal, a source, a gate and a back gate; and a control circuit controlling the pull-up transistor so that no currents flow in a first current path formed from the drain to the back gate and a second path formed from the drain to the source.

The above objects of the present invention are also achieved by a system comprising: a circuit board; a plurality of semiconductor devices mounted on the circuit board and connected together via a bus, at least one of the plurality of semiconductor devices including a pull-up circuit, the pull-up circuit comprising: a pull-up transistor of a P-channel type having a drain coupled to the bus via the terminal, a source having a first power supply potential V1 from a first power supply line, a gate and a back gate; a first power supply circuit which defines a well potential approximately equal to a higher one of the first power supply potential and a potential Vx applied to the drain from the bus via the terminal and sets the back gate to the well potential; and a second power supply circuit which defines a gate potential so the gate potential is approximately equal to the potential Vx when the potential Vx exceeds the first power supply potential and is approximately equal to a second power supply potential V2 that is supplied from a second power supply line and is lower than the first power supply potential, the gate being set to the gate potential defined by the second power supply circuit.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
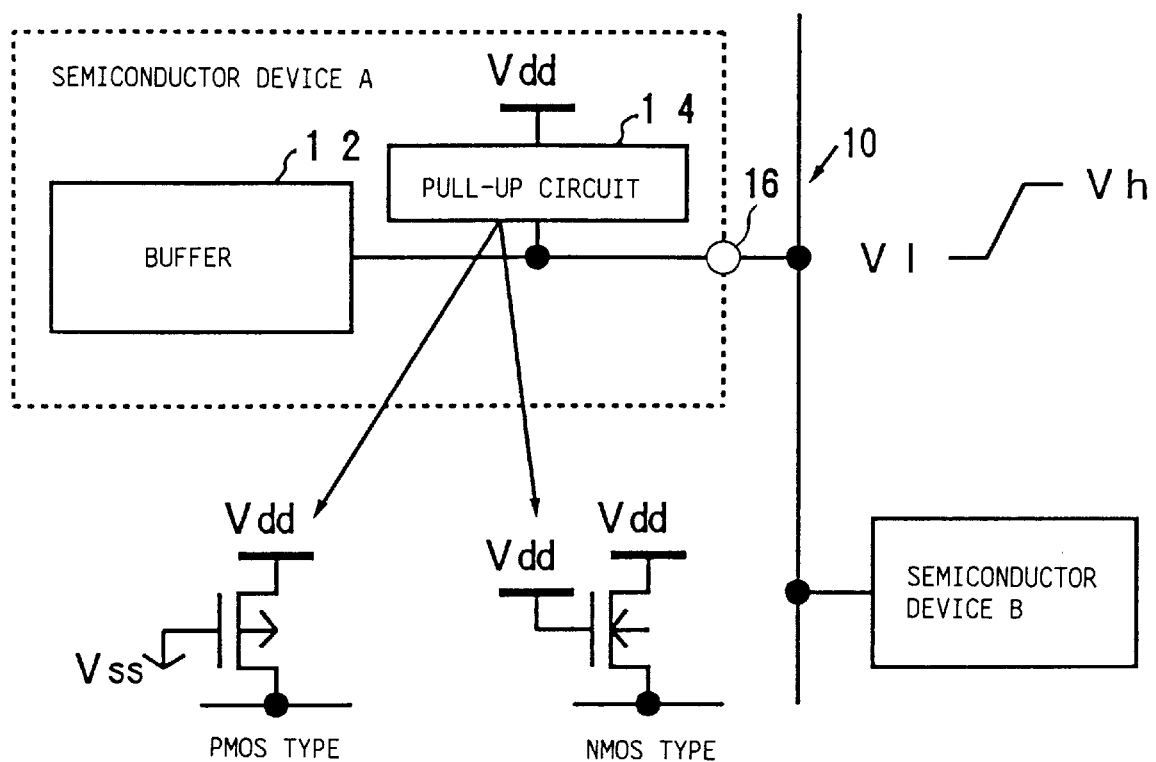
FIG. 1 is a block diagram of a system having semiconductor devices equipped with a conventional pull-up circuit.
Figure 2:
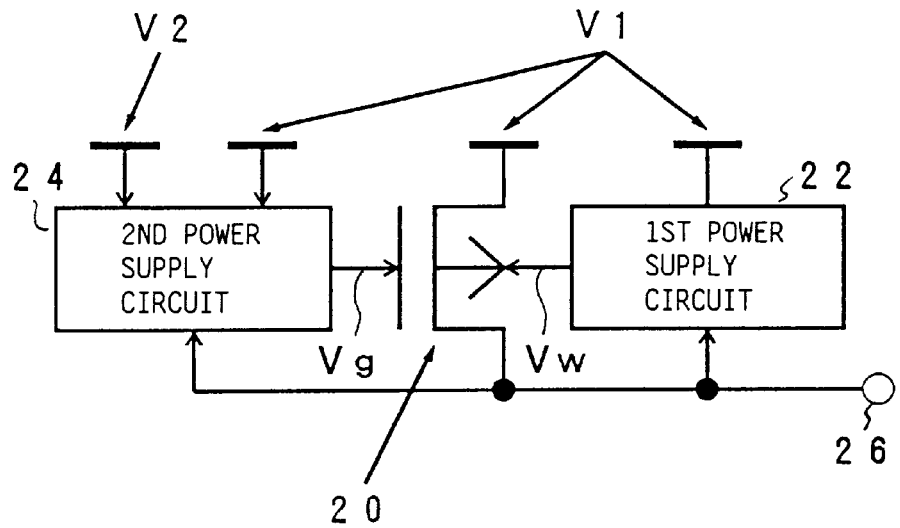
FIG. 2 is a block diagram of a pull-up circuit according to the present invention.

FIG. 2 is a block diagram showing the principle of a pull-up circuit according to the present invention. The pull-up circuit shown in FIG. 2 is equipped with a pull-up PMOS transistor 20, a first power supply circuit 22, a second power supply circuit 24 and a terminal 26. The pull-up circuit shown in FIG. 2 is replaced by the pull-up circuit 14 shown in FIG. 1. The first power supply circuit 22 controls a current path (diode) from the drain of the pull-up PMOS transistor 20 to the back gate (an N-type well). The second power supply circuit 24 controls a current path (diode) from the drain of the pull-up PMOS transistor 20 to the source thereof. A control circuit for controlling the pull-up PMOS transistor 20 is formed by the first power supply circuit 22 and the second power supply circuit 24.

The first power supply circuit 22 compares a potential Vx of the terminal 26 with a first power supply potential V1 (which corresponds to the aforementioned power supply voltage Vdd), and generates a well potential Vw, which is equal to or approximately equal to the higher one of the potential Vx and the first power supply potential V1. The following description assumes that the well potential Vw is equal to the higher one. Then, the first power supply circuit 22 applies the well potential Vw to the back gate (N-type well) of the pull-up PMOS transistor 20. The terminal 26 is connected to the bus shown in FIG. 1. When the potential of the terminal 26 is equal to 0 V, then Vx<V1, and thus the first power supply circuit 22 sets the potential of the back gate of the pull-up PMOS transistor 20 to the potential Vdd. Hence, a voltage is applied, in the reverse direction, across the diode which has the forward direction from the drain to the back gate (N-type well), so that no current flows in the diode.

If the potential of the bus 10, that is, the potential Vx of the terminal 26 becomes higher than the first power supply voltage V1, the first power supply circuit 22 sets the back gate to the potential Vx. Hence, a voltage is applied, in the reverse direction, across the diode having the forward direction from the drain to the back gate, so that no currents flows in the diode. Hence, even if the potential Vx of the terminal 26 becomes higher than the first power supply potential V1, no current flows in the pull-up circuit from the bus 10.

The second power supply circuit 24 compares the potential Vx of the terminal 26 with the first power supply voltage V1. When Vx>V1, then the second power supply circuit 24 applies a gate potential Vg to the gate of the pull-up PMOS transistor 20, wherein the gate potential Vg is equal to or approximately equal to the potential Vx. The following description assumes that Vg=Vx. When Vx<V1, the second power supply circuit 24 applies the gate potential Vg to the gate of the pull-up PMOS transistor 20, wherein the gate potential Vg is equal to the second power supply potential V2 (<V1). Hence, even if the potential Vx of the terminal 26 exceeds the first power supply potential V1, the gate of the pull-up PMOS transistor 20 is fixed to the potential Vx, and thus the pull-up PMOS transistor 20 is OFF. As a result, no current flows in the pull-up circuit from the bus 10.

It can be seen from the above description that the pull-up PMOS transistor 20 has a threshold level which causes the PMOS transistor 20 to be OFF when Vx>V1 (Vg =Vw=Vx) and to be ON when Vx<V1 (Vg=V2, Vw=V1).

Figure 3:
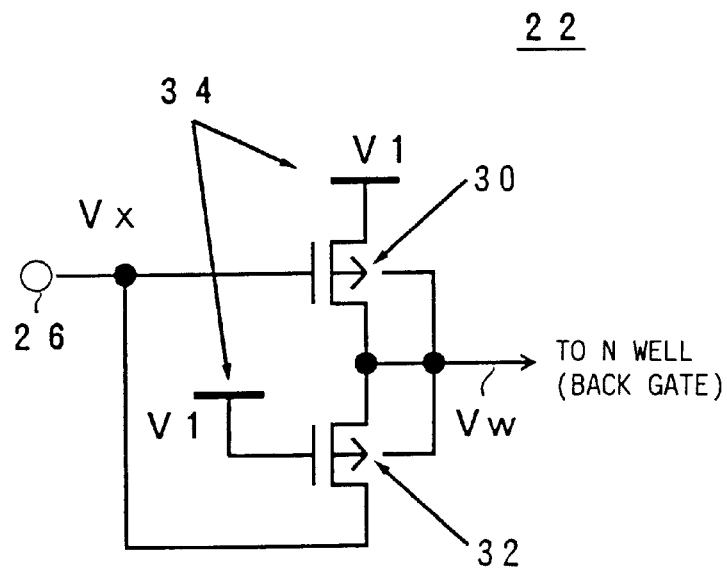
FIG. 3 is a first power supply circuit used in the pull-up circuit shown in FIG. 2.

FIG. 3 is a circuit diagram of a configuration of the first power supply circuit 22. The first power supply circuit 22 includes a first PMOS transistor 30 and a second PMOS transistor 32. The source of the first PMOS transistor 30 and the gate of the second PMOS transistor 32 are connected to a first power supply line 34 of the potential V1. The gate of the first PMOS transistor 30 and the drain of the second PMOS transistor 32 are connected to the terminal 26. The drain of the first PMOS transistor 30, the source of the second PMOS transistor 32, and the back gates of these transistors are connected to the N-type well (back gate) of the pull-up PMOS transistor 20 shown in FIG. 2. The first PMOS transistor 30 and the second PMOS transistor 32 function as switching elements, which are not limited to the PMOS transistors.

When the potential Vx of the terminal 26 is lower than the first power supply potential (Vx<V1), the first PMOS transistor 30 is ON, and the second PMOS transistor 32 are OFF. Hence, the N-type well (back gate) of the pull-up PMOS transistor 20 is fixed to the first power supply potential V1 (=Vw). Hence, the drain and back gate of the pull-up PMOS transistor 20 have an identical potential, which prevents a current from flowing from the drain to the back gate.

Figure 4A:
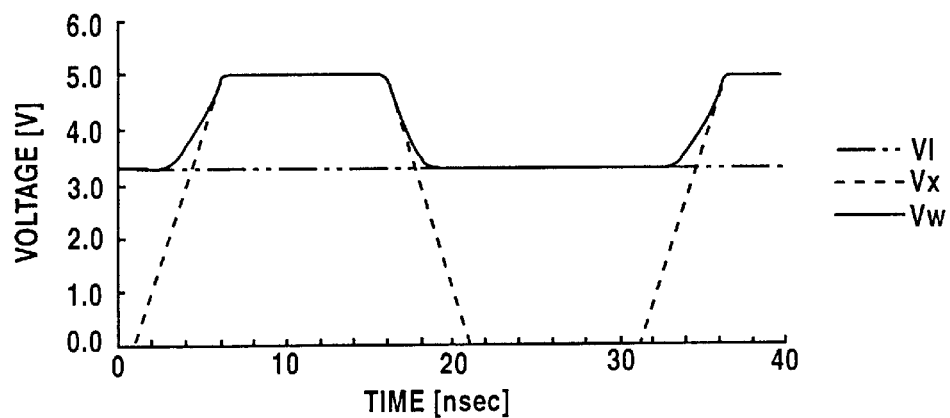
FIGS. 4A, 4B and 4C are waveform diagrams of operations of the pull-up circuit shown in FIG. 2.

FIG. 4A is a diagram showing variations in the first power supply potential V1, the potential of the terminal 26 and the well potential Vw.

Figure 5:
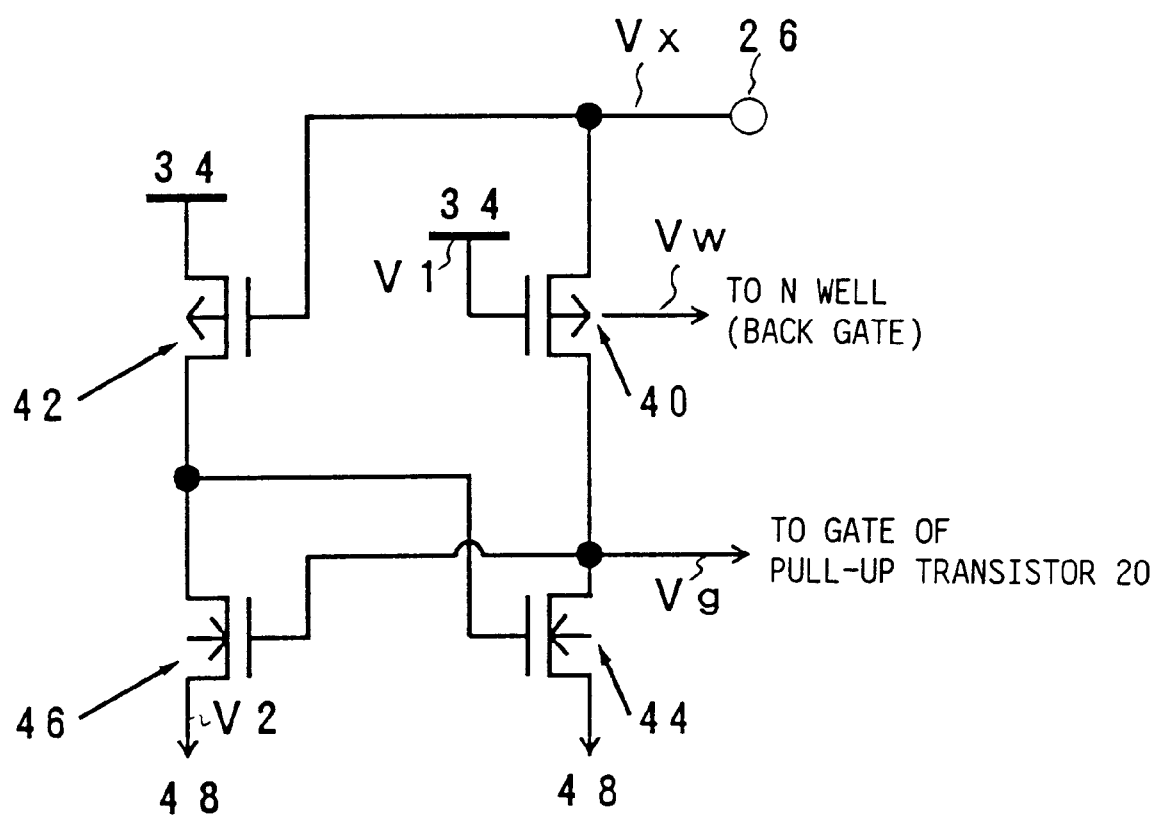
FIG. 5 is a circuit diagram of a second power supply circuit used in the pull-up circuit shown in FIG. 2.

FIG. 5 is a circuit diagram of a configuration of the second power supply circuit shown in FIG. 2. The second power supply circuit 24 includes a third PMOS transistor 40, a fourth PMOS transistor 42, a first NMOS transistor 44, and a second NMOS transistor 46. The terminal 26 is connected to the source of the third PMOS transistor 40 and the gate of the fourth PMOS transistor 42. The first power supply line 34 of the first power supply potential V1 is connected to the gate of the third PMOS transistor 40 and the source of the fourth PMOS transistor 42. The drain of the third PMOS transistor 40 and the drain of the first NMOS transistor 44 are connected to the gate of the second NMOS transistor 46 and the gate of the pull-up PMOS transistor 20. The drain of the fourth PMOS transistor 42 is connected to the gate of the first NMOS transistor 44 and the drain of the second NMOS transistor 46. The source of the first NMOS transistor 44 and the source of the second NMOS transistor 46 are connected to a second power supply line 48 of the second power supply potential V2. The fourth PMOS transistor 42 and the first NMOS transistor 44 function as a switch control circuit which controls the third PMOS transistor 40 and the second NMOS transistor 46 which function as switch elements.

When the potential Vx of the terminal 26 is lower than the first power supply potential V1 (Vx<V1), the fourth PMOS transistor 42 is turned ON, and the first power supply voltage V1 is applied to the gate of the first NMOS transistor 44 (Vg=V1). Hence, the first NMOS transistor 44 is turned ON, and the gate of the pull-up PMOS transistor 20 becomes equal to the second power supply potential V2 (<V1), which is, for example, the ground level. Hence, when Vx<V1, then the pull-up PMOS transistor 20 is turned ON. In this case, the third PMOS transistor 40 and the second NMOS transistor 46 are OFF.

When the potential Vx of the terminal 26 exceeds the first power supply potential V1 (Vx>V1), the third PMOS transistor 40 is turned ON, and the voltage V1 is applied to the gate of the second NMOS transistor 46. Hence, the second NMOS transistor 46 is turned ON, and the drain of the fourth PMOS transistor 42 and the gate of the first NMOS transistor 44 become equal to the second power supply potential V2. Hence, the fourth PMOS transistor 42 and the first NMOS transistor are OFF. As a result, the gate of the pull-up PMOS transistor 20 is supplied with the potential Vx via the third PMOS transistor 40 (Vg=Vx). Hence, the pull-up PMOS transistor 20 is OFF. Thus, even when Vx>V1, no current cannot flow from the drain of the pull-up transistor 20 to the source thereof.

Figure 4B:
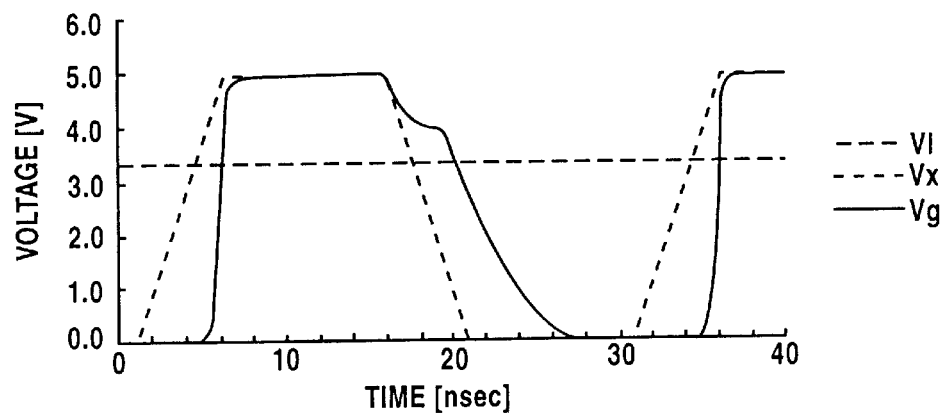

FIG. 4B is a diagram which relates to the second power supply circuit 24 and shows variations in the first power supply potential V1, the potential Vx of the terminal 26 and the gate potential Vg.

Figure 6:
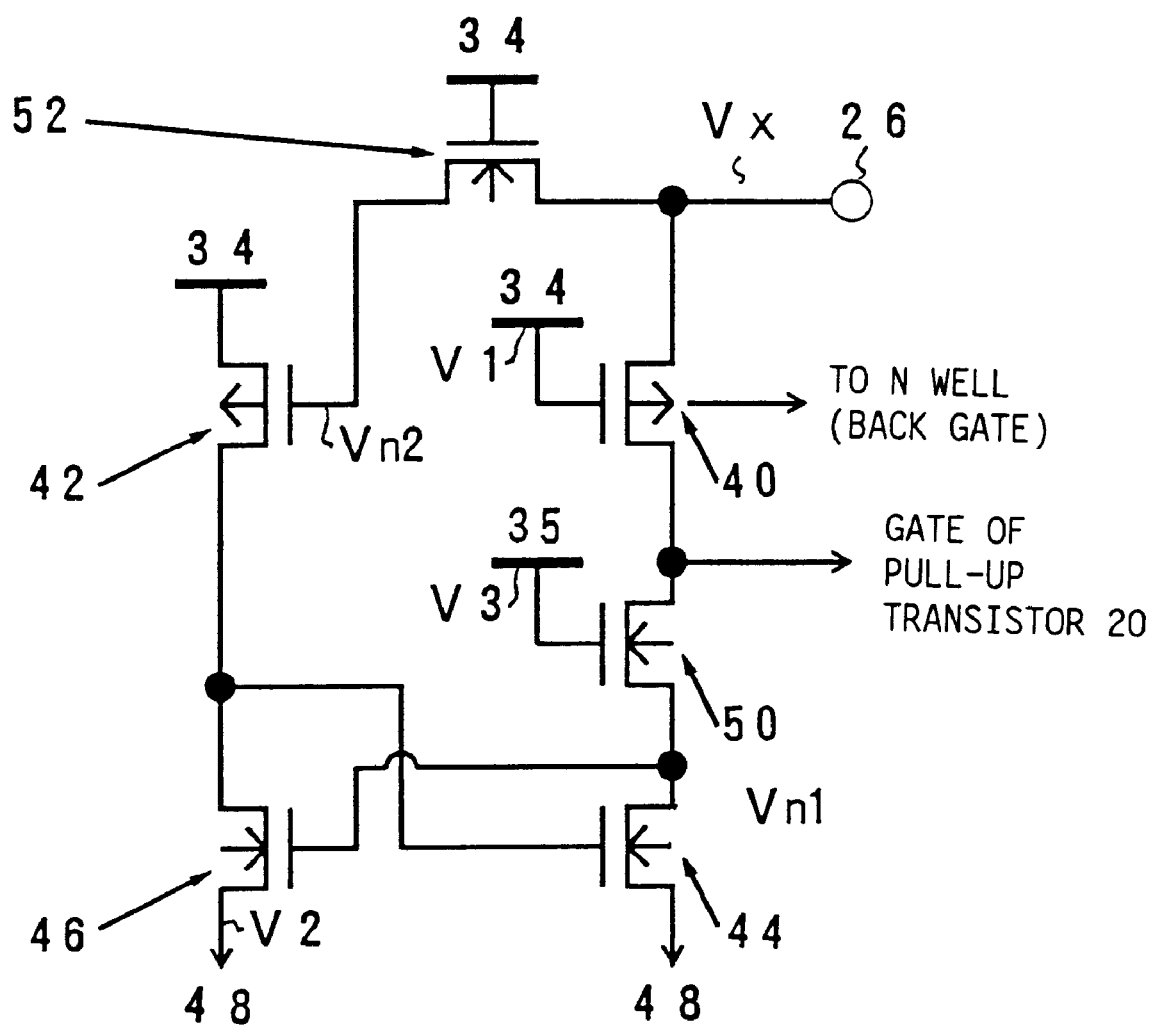
FIG. 6 is a circuit diagram of another configuration of the second power supply circuit.

FIG. 6 is a circuit diagram of another configuration of the second power supply circuit 24. In FIG. 6, parts that are the same as those shown in FIG. 5 are given the same reference numbers. The second power supply circuit 24 shown in FIG. 6 is configured by adding a third NMOS transistor 50 and a fourth NMOS transistor 52 to the configuration shown in FIG. 5. The third NMOS transistor 50 is provided between the third PMOS transistor 40 and the first NMOS transistor 44. The gate of the third NMOS transistor 50 is fixed to a third power supply potential V3 via a third power supply line 35. The third power supply line V3 is higher than the source potential of the third NMOS transistor 50 by at least the threshold voltage thereof, and is equal to, for example, the potential V1. The fourth NMOS transistor 52 is provided between the terminal 26 and the gate of the fourth PMOS transistor 42. The gate of the fourth NMOS transistor 52 is fixed to the first power supply potential V1.

The third NMOS transistor 50 and the fourth NMOS transistor 52 are provided so that all the MOS transistors forming the second power supply circuit 24 have an identical breakdown voltage (in other words, an identical size). Hence, the production process can be simplified.

In the configuration shown in FIG. 5, the voltage Vx higher than the first power supply voltage V1 may be applied across the drain and source of the first NMOS transistor 44 or the drain and gate thereof. More particularly, when the third PMOS transistor 40 is turned ON, the voltage V1 (equal to, for example, 5 V) is applied to the drain of the first NMOS transistor 44. Hence, the voltage between the drain and source of the first NMOS transistor 44 is equal to 5 V, and the voltage between the gate and source of the second NMOS transistor 46 becomes equal to 5 V. Further, the voltage between the drain and gate of the fourth PMOS transistor 42 becomes equal to 5 V. Hence, it is required that these transistors have a size which realizes a breakdown voltage defined by taking into account the above 5 V voltage. For example, an increased thickness of the gate oxide film is used.

In contrast, by providing the third NMOS transistor 50 and the fourth NMOS transistor 52, all the MOS transistors shown in FIG. 6 can be formed so as to have an identical size which realizes a breakdown voltage defined by taking into account the power supply voltage V1. The source potential of the third NMOS transistor 50 is equal to a level obtained by subtracting the threshold level of the third NMOS transistor 50 from its gate potential, that is, the third power supply potential V3. Hence, even if the drain potential of the third NMOS transistor 50 is equal to the first power supply potential V1, the source potential of the third NMOS transistor 50 is lower than the gate potential V3 by the threshold voltage thereof. As a result, there is no possibility that the drain of the first NMOS transistor 44 and the gate of the second NMOS transistor 46 have the potential Vx (equal to, for example, 5 V) higher than the first power supply potential V1. Similarly, the gate potential of the fourth PMOS transistor 42 is lower than the first power supply voltage V1 by the threshold voltage thereof. Hence, even if the potential of the terminal 26 becomes equal to Vx higher than the first power supply voltage V1, the gate potential of the fourth PMOS transistor 42 cannot exceed the level defined by subtracting the threshold voltage thereof from the first power supply potential V1.

Hence, each of all the MOS transistors receives a voltage lower than the first power supply voltage V1 between the gate and the drain, between the gate and the source, between the back gate (well) and the gate, and between the source and the drain. Thus, all the MOS transistors can be formed so that they have an identical breakdown voltage (which withholds the first power supply voltage V1) and have an identical size.

Figure 4C:
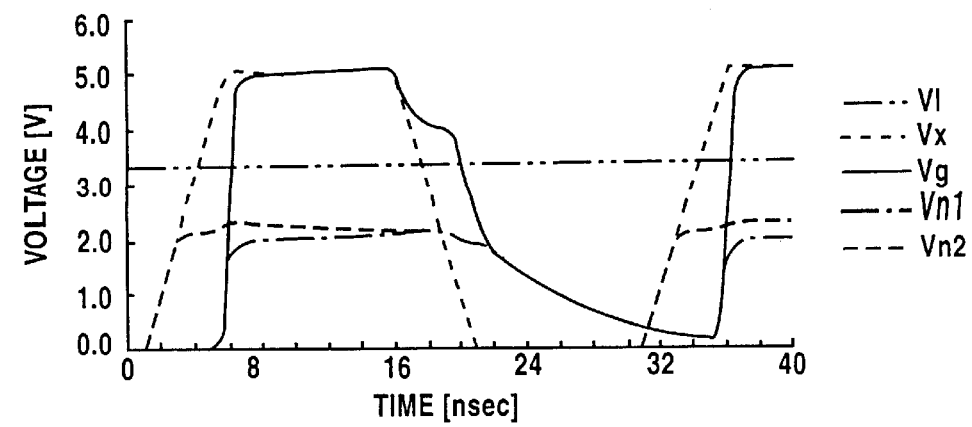

FIG. 4C relates to the configuration shown in FIG. 6 and shows variations in the first power supply potential V1, the potential Vx of the terminal 26, the gate potential Vg of the pull-up PMOS transistor 20, the source potential Vn1 of the third NMOS transistor 50, and the gate potential Vn2 of the fourth PMOS transistor 42.

Figure 7:
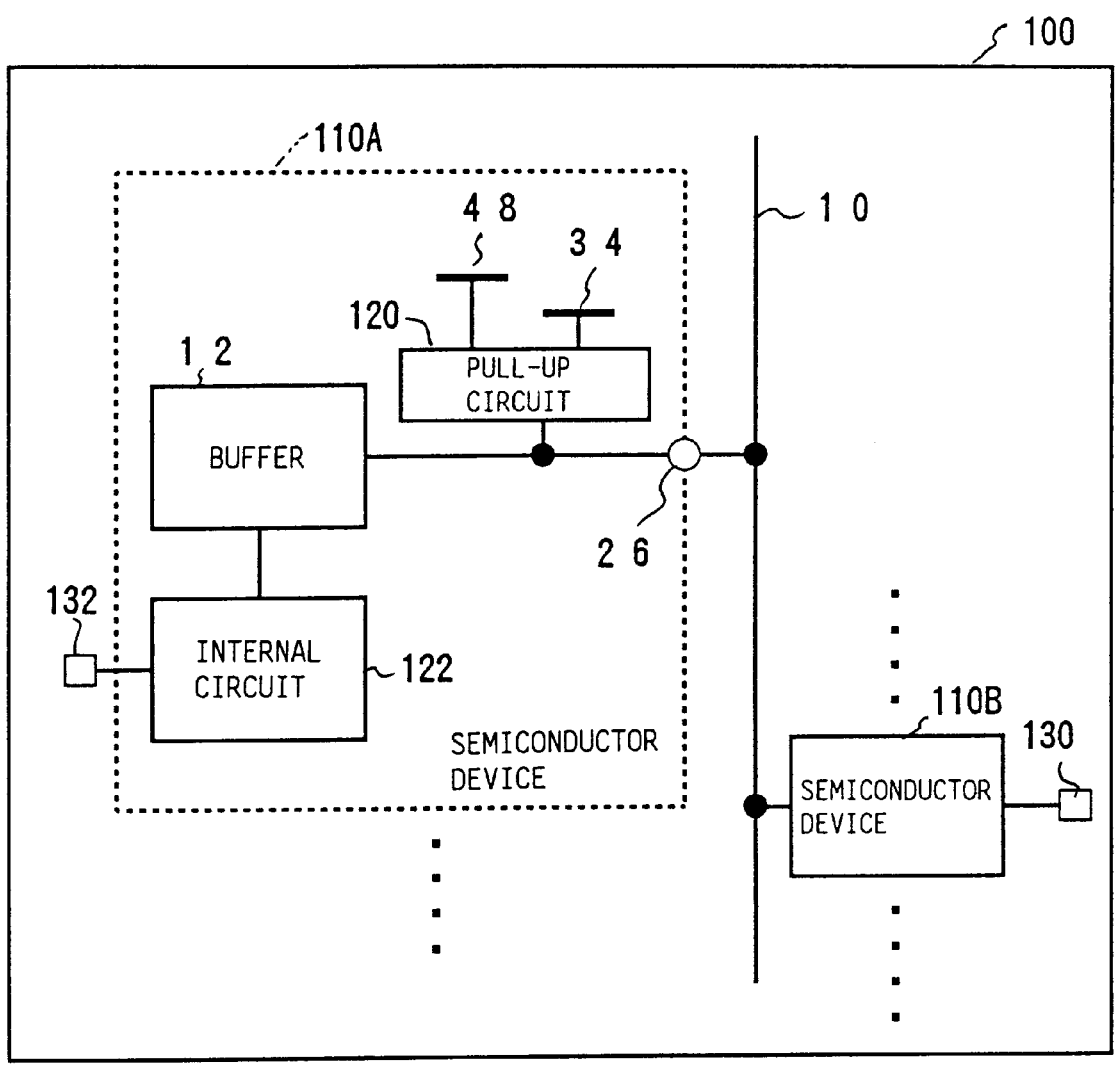
FIG. 7 is a block diagram of a system using semiconductor devices configured according to the present invention.

FIG. 7 is a block diagram of a system according to the present invention, in which parts that are the same as those shown in the previously described figures are given the same reference numbers. The system shown in FIG. 7 is a circuit board 100, which includes semiconductor devices 110A and 110B connected together via the bus 10. In practice, many semiconductor devices will be mounted on the circuit board 100. However, only two semiconductor devices 110A and 110B are illustrated in FIG. 7 for the sake of simplicity.

The semiconductor device 110A operates with a voltage of, for example, 3.3 V (equal to V1) via a power supply terminal 132. The semiconductor device 110B operates with a voltage of, for example, 5 V via a power supply terminal 130. The semiconductor device 110B sets the potential of the bus 10 to 0 V or 5 V in accordance with data to be transmitted. The semiconductor device 110A sets the potential of the bus 10 to 0 V or 3.3 V in accordance with data to be transmitted. Usually, the semiconductor devices have an output interface having an output buffer (formed of, for example, a CMOS inverter). Such an output interface sets the potential of the data 10 to the power supply voltage or the ground level in accordance with data to be transmitted to the bus 10.

The semiconductor device 110A includes a pull-up circuit 120, the buffer 12 and an internal circuit 122. The buffer 12 is, for example, a bidirectional buffer. The buffer 12 receives data from the bus 10 via the terminal 26, the received data being read therefrom and supplied to the internal circuit 122. Further, the buffer 12 receives data from the internal circuit 122, the received data being read therefrom and supplied to the bus 10. The pull-up circuit 120 is configured according to the present invention as shown in FIG. 2. That is, the pull-up circuit 120 includes the pull-up PMOS transistor 20, the first power supply circuit 22 and the second power supply circuit 24. The first power supply circuit 22 is configured as shown in FIG. 3, and the second power supply circuit 24 is configured as shown in FIG. 5 or FIG. 6.

The pull-up circuit 120 is configured as has been previously described. Hence, even when the semiconductor device 110B drives the bus to a high level (equal to, for example, 5 V), no currents flow from the bus to the power supply line or ground via the pull-up circuit 120. Hence, even when the potential of the bus 10 becomes higher than the power supply voltage for the pull-up use, no currents from the bus 10 flow, so that the pull-up operation can be certainly performed without increasing the transistor breakdown voltage. Hence, the semiconductor device 110B connected to the bus 10 is not affected when the bus 10 is driven by the semiconductor device 110A.

The above-mentioned embodiments of the present invention employ the MOS transistors, and may employ other types of field effect transistors or bipolar transistors. The present invention includes all system having an interface with a bus or a signal line which is driven to different voltages by circuits. In the foregoing, only one terminal 26 is described. In practice, the bus 10 consists of a plurality of bits. Hence, the pull-up circuits 120 are provided to the respective bits of the bus 10.

The present invention is not limited to the specifically described embodiments and variations, and other variations and modifications may be made without departing from the scope of the present invention.

What is claimed is:

1. A pull-up circuit comprising:
    a pull-up transistor of a P-channel type having a drain coupled to a bus via a terminal, a source, a gate and a back gate; and
    a control circuit controlling the pull-up transistor so that no current flow in a first current path formed from the drain to the back gate and no current flows in a second path formed from the drain to the source only when a drain potential of the pull-up transistor is higher than a source potential thereof.

2. The pull-up circuit as claimed in claim 1, wherein the control circuit controls the gate and the back gate so that no currents flow in the first and second current paths.

3. A pull-up circuit comprising:
    a pull-up transistor of a P-channel type having a drain coupled to a bus via a terminal, a source having a first power supply potential V1 from a first power supply line, a gate and a back gate;
    a first power supply circuit which defines a well potential approximately equal to a higher one of the first power supply potential and a potential Vx applied to the drain from the bus via the terminal and sets the back gate to the well potential; and
    a second power supply circuit which defines a gate potential so the gate potential is approximately equal to the potential Vx when the potential Vx exceeds the first power supply potential and is approximately equal to a second power supply potential V2 that is supplied from a second power supply line and is lower than the first power supply potential,
    the gate being set to the gate potential defined by the second power supply circuit.

4. The pull-up circuit as claimed in claim 3, wherein the pull-up transistor has a threshold level by which the pull-up transistor is turned OFF when the potential Vx exceeds the first power supply potential V1 and is turned ON when the potential Vx is lower than the first power supply potential V1.

5. The pull-up circuit as claimed in claim 3, wherein the first power supply circuit comprises:
    a first switch element which is provided between the first power supply line and the back gate and which is turned OFF when Vx>V1 and is turned ON when Vx<V1; and
    a second switch element which is provided between the terminal and the back gate and which is turned ON when Vx>V1 and is turned OFF when Vx<V1.

6. The pull-up circuit as claimed in claim 5, wherein:
    the first switch element is a first P-channel transistor having a back gate set to the well potential defined by the first power supply circuit, and a gate set to the potential Vx; and
    the second switch element is a second P-channel transistor having a back gate set to the well potential, and a gate set to the first power supply voltage V1.

7. The pull-up circuit as claimed in claim 5, wherein the second power supply circuit comprises:
    a third switch element which is provided between the terminal and the gate of the pull-up transistor and which is turned ON when Vx>V1 and is turned OFF when Vx<V1;
    a fourth switch element which is provided between the gate of the pull-up transistor and the second power supply line; and
    a switch control circuit which turns OFF the fourth switch when Vx>V1 and turns ON the fourth switch when Vx<V1.

8. The pull-up circuit as claimed in claim 3, wherein the second power supply circuit comprises:
    a third switch element which is provided between the terminal and the gate of the pull-up transistor and which is turned ON when Vx>V1 and is turned OFF when Vx<V1;

a fourth switch element which is provided between the gate of the pull-up transistor and the second power supply line; and a switch control circuit which turns OFF the fourth switch when Vx>V1 and turns ON the fourth switch when Vx<V1.

9. The pull-up circuit as claimed in claim 8, wherein:

the third switch element is a third P-channel transistor having a back gate set to the well potential defined by the first power supply circuit, and a gate set to the power supply potential V1; and the fourth switch element is a first N-channel transistor having a gate potential controlled by the switch control circuit.

10. The pull-up circuit as claimed in claim 8, wherein the switch control circuit comprises:

a fifth switch element which is connected between the first power supply line and a control terminal of the fourth switch element and which is turned OFF when Vx>V1 and is turned ON when Vx<V1; and a sixth switch element which is connected between the second power supply line and the control terminal of the fourth switch element and which is turned ON when Vx>V1 and is turned OFF when Vx<V1.

11. The pull-up circuit as claimed in claim 10, wherein:

the fifth switch element is a fourth P-channel transistor having a gate set to the potential Vx; and the sixth switch element is a second N-channel transistor having a gate set to the gate potential.

12. The pull-up circuit as claimed in claim 10, further comprising:

a third N-channel transistor which is provided between a first node at which the third switch element and the gate of the pull-up transistor are connected and a second node at which the second and sixth switch elements are connected and which has a gate supplied with a third power supply potential V3 so that the third N-channel transistor is turned ON when the fourth switch element is turned ON; and a fourth N-channel transistor which is provided between the fifth switch element and the terminal and has a gate supplied with the first power supply potential V1.

13. A semiconductor device comprising:

a buffer coupled to a terminal to which a bus is connected; and a pull-up circuit, said pull-up circuit comprising:

a pull-up transistor of a P-channel type having a drain coupled to the bus via the terminal, a source, a gate and a back gate; and a control circuit controlling the pull-up transistor so that no current flows in a first current path formed from the drain to the back gate and no current flows in a second path formed from the drain to the source only when a drain potential of the pull-up transistor is higher than a source potential thereof.

14. The semiconductor device as claimed in claim 13, wherein the control circuit controls the gate and the back gate so that no currents flow in the first and second current paths.

15. A semiconductor device comprising:

a buffer coupled to a terminal to which a bus is connected; and a pull-up circuit, said pull-up circuit comprising:

a pull-up transistor of a P-channel type having a drain coupled to the bus via the terminal, a source having a first power supply potential V1 from a first power supply line, a gate and a back gate;

a first power supply circuit which defines a well potential approximately equal to a higher one of the first power supply potential and a potential Vx applied to the drain from the bus via the terminal and sets the back gate to the well potential; and a second power supply circuit which defines a gate potential so the gate potential is approximately equal to the potential Vx when the potential Vx exceeds the first power supply potential and is approximately equal to a second power supply potential V2 that is supplied from a second power supply line and is lower than the first power supply potential, the gate being set to the gate potential defined by the second power supply circuit.

16. A system comprising:

a circuit board;

a plurality of semiconductor devices mounted on the circuit board and connected together via a bus, at least one of the plurality of semiconductor devices including a pull-up circuit, said pull-up circuit comprising:

a pull-up transistor of a P-channel type having a drain coupled to the bus via the terminal, a source, a gate and a back gate; and a control circuit controlling the pull-up transistor so that no current flows in a first current path formed from the drain to the back gate and no current flows in a second path formed from the drain to the source only when a drain potential of the pull-up transistor is higher than a source potential thereof.

17. The system as claimed in claim 16, wherein the control circuit controls the gate and the back gate so that no currents flow in the first and second current paths.

18. A system comprising:

a circuit board;

a plurality of semiconductor devices mounted on the circuit board and connected together via a bus, at least one of the plurality of semiconductor devices including a pull-up circuit, said pull-up circuit comprising:

a pull-up transistor of a P-channel type having a drain coupled to the bus via the terminal, a source having a first power supply potential V1 from a first power supply line, a gate and a back gate;

a first power supply circuit which defines a well potential approximately equal to a higher one of the first power supply potential and a potential Vx applied to the drain from the bus via the terminal and sets the back gate to the well potential; and a second power supply circuit which defines a gate potential so the gate potential is approximately equal to the potential Vx when the potential Vx exceeds the first power supply potential and is approximately equal to a second power supply potential V2 that is supplied from a second power supply line and is lower than the first power supply potential, the gate being set to the gate potential defined by the second power supply circuit.

* * * * *